(12) United States Patent
Bayless et al.

(10) Patent No.: US 11,289,360 B2
(45) Date of Patent: Mar. 29, 2022

(54) METHODS AND APPARATUS FOR PROTECTION OF DIELECTRIC FILMS DURING MICROELECTRONIC COMPONENT PROCESSING

(71) Applicant: Micron Technology, Inc., Boise, ID (US)

(72) Inventors: Andrew M. Bayless, Boise, ID (US); Brandon P. Wirz, Boise, ID (US); Wei Zhou, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 16/715,540

(22) Filed: Dec. 16, 2019

(65) Prior Publication Data

US 2021/0183682 A1    Jun. 17, 2021

(51) Int. Cl.
*H01L 21/683* (2006.01)
*H01L 21/78* (2006.01)
*H01L 21/67* (2006.01)

(52) U.S. Cl.
CPC .... *H01L 21/6836* (2013.01); *H01L 21/67092* (2013.01); *H01L 21/67132* (2013.01); *H01L 21/78* (2013.01); *H01L 2221/6834* (2013.01); *H01L 2221/68327* (2013.01)

(58) Field of Classification Search
CPC ........... H01L 21/6836; H01L 21/67092; H01L 21/67132; H01L 21/78; H01L 2221/6834; H01L 2221/68327

USPC ........................................................ 438/464
See application file for complete search history.

(56) References Cited

U.S. PATENT DOCUMENTS

| | | | |
|---|---|---|---|
| 6,762,074 B1 * | 7/2004 | Draney | H01L 21/6835 257/E21.505 |
| 7,906,410 B2 * | 3/2011 | Arita | H01L 21/6836 438/462 |
| 8,043,698 B2 * | 10/2011 | Morishima | H01L 21/6836 428/343 |
| 8,883,615 B1 * | 11/2014 | Holden | H01J 37/32009 438/462 |
| 9,093,549 B2 | 7/2015 | Wasserman et al. | |
| 9,426,898 B2 | 8/2016 | Frick et al. | |
| 9,536,856 B2 | 1/2017 | Seyama | |
| 10,217,637 B1 * | 2/2019 | Budd | H01L 23/544 |
| 2014/0175159 A1 | 6/2014 | Kostner | |
| 2019/0027075 A1 * | 1/2019 | Hughes | H01L 27/156 |

FOREIGN PATENT DOCUMENTS

WO    2014/043545 A1    3/2014

* cited by examiner

*Primary Examiner* — Vu A Vu
(74) *Attorney, Agent, or Firm* — TraskBritt (57) ABSTRACT

Disclosed are methods and apparatus for protecting dielectric films on microelectronic components from contamination associated with singulation, picking and handling of singulated microelectronic components from a wafer for assembly with other components.

24 Claims, 9 Drawing Sheets

METHODS AND APPARATUS FOR PROTECTION OF DIELECTRIC FILMS DURING MICROELECTRONIC COMPONENT PROCESSING

TECHNICAL FIELD

Embodiments disclosed herein relate to methods and apparatus for protection of dielectric films during microelectronic component processing. More particularly, embodiments disclosed herein relate to methods and apparatus for protecting dielectric films from surface contamination during before and during stacking of microelectronic components to form an assembly.

BACKGROUND

As performance of electronic devices and systems increases, there is an associated demand for improved performance of microelectronic components of such systems, while maintaining or even shrinking the form factor. Such demands are often, but not exclusively, associated with mobile devices and high-performance devices. To maintain or reduce the footprint and height of an assembly of components in the form of microelectronic devices (e.g., semiconductor die), three-dimensional (3D) assemblies of stacked components equipped with so-called through silicon vias (TSVs) for vertical electrical (i.e., signal, power, ground/bias) communication between components of the stack have become more common, as has the employment of preformed dielectric films in the bond lines between components to reduce bond line thickness while increasing bond line uniformity. Such films include, for example, so-called non-conductive films (NCFs), and wafer level underfills (WLUFs), such terms often being used interchangeably. Non-limiting examples of microelectronic devices comprising stacked components in the form of memory die include so-called high bandwidth memory (HBMx), hybrid memory cubes (HBMs), and chip to wafer (C2W) assemblies.

In practice, and using the term NCF for the sake of convenience, an NCF is adhered over, and to, an active surface of a bulk semiconductor substrate, generally in the form of a wafer, for example a silicon wafer. The wafer, while supported on dicing tape supported on a film frame, is then singulated, for example by a diamond-coated dicing blade, along so-called "streets" between adjacent semiconductor die locations on the wafer to provide individual semiconductor die, each having an NCF on its active surface. Even though the NCF may be laminated to a protective film during transport and handling, once the NCF is laminated to the wafer, that protective film is then stripped before singulation occurs, exposing the upper, exposed surface of the NCF to contamination during subsequent die handling and stacking.

Specifically, it has been found that particles generated by the singulation process and incidentally deposited on the exposed surface of the NCF may cause significant decreases in die yield per wafer. Such particles may be inorganic, for example silicon debris, or organic, such as NCF residue, dicing tape residue or particulates from other sources within a clean room environment. Silicon particles may, for example, cause die cracking when particle size exceeds bond line thickness, while organic particles, if located on conductive elements such as solder-capped conductive pillars or under bump metallization (UBM) for solder bumps, may cause solder non-wetting, compromising electrical communication between stacked die.

Figure 1:
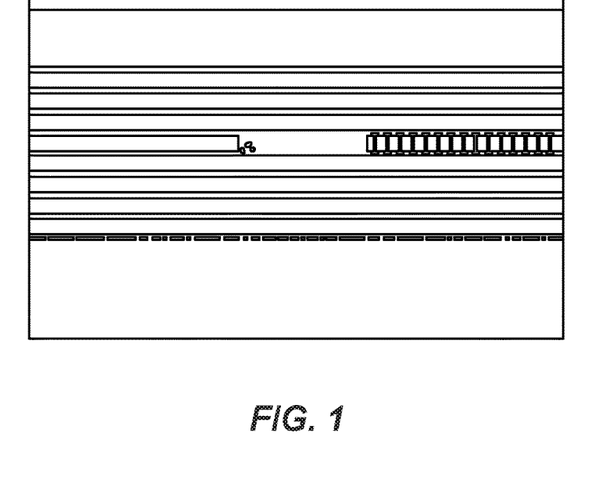
FIG. 1 is a schematic of die cracks due to silicon particles in the bondline.
Figure 2:
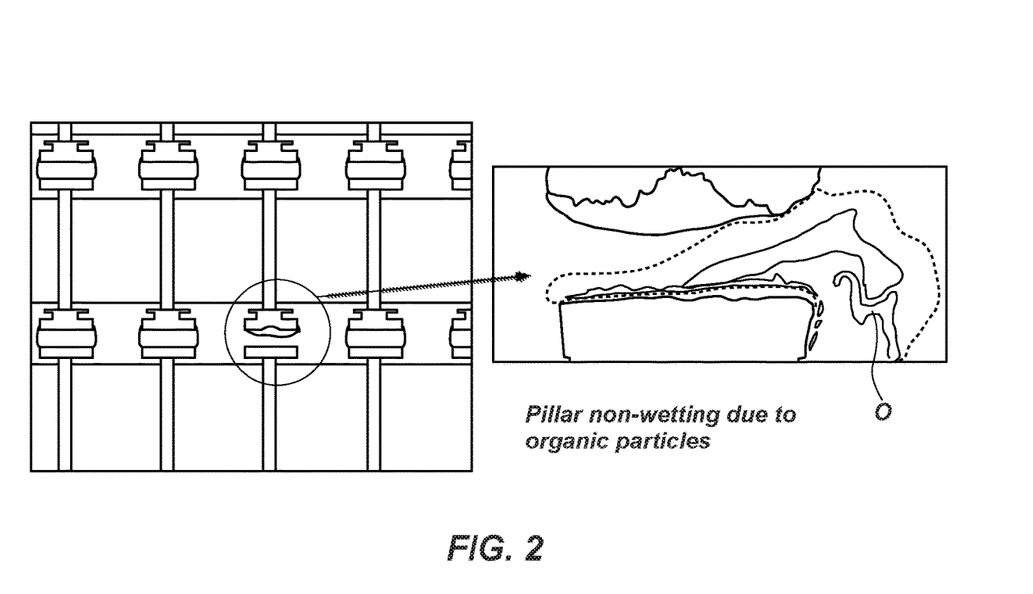
FIG. 2 on the left-hand side is a schematic of a bond line between two adjacent, stacked semiconductor die and on the right-hand side is an enlarged view of the left-hand circled pillar-to-pad arrangement showing pillar non-wetting and resulting open connection due to the presence of foreign organic material.
Figure 3:
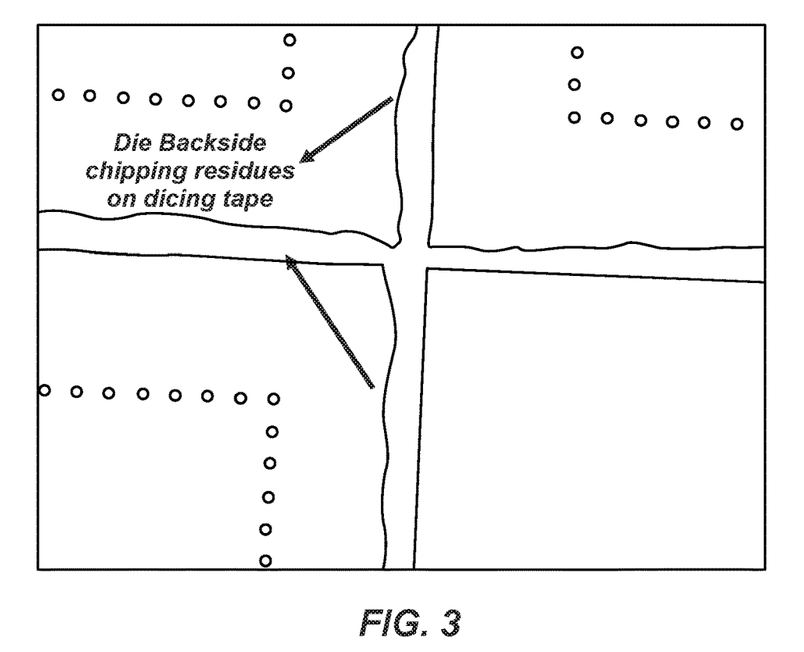
FIG. 3 is a schematic showing die backside chipping residues from dicing on the dicing tape.
Figure 4:
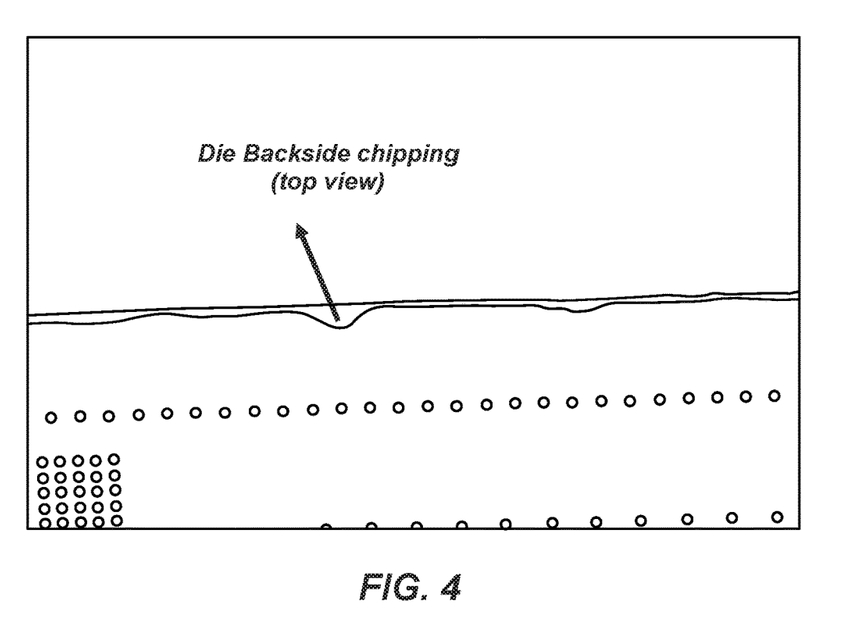
FIG. 4 is a schematic showing die backside chipping from dicing.

FIG. 1 of the drawings is a schematic of die cracks due to silicon particles in the bond line, when silicon particles of, a size greater than a bond line thickness are interposed between two stacked semiconductor die. FIG. 2 on the left-hand side is a schematic of a bond line between two adjacent, stacked semiconductor die and on the right-hand side is an enlarged view of the left-hand circled pillar-to-pad arrangement showing pillar non-wetting and resulting open connection due to the presence of foreign organic material O on the pillar-to-pad interface. FIG. 3 is a schematic showing die backside chipping residues from dicing on the dicing tape, while FIG. 4 is a schematic showing die backside chipping from dicing.

Both of the foregoing types of particulate contaminants on an exposed NCF surface have been determined to cause significant reduction in die yield, particularly if a blade dicing (i.e., singulation) process is employed, creating sizable and numerous particulate debris. Notably, die yield from NCF contamination becomes progressively worse during processing, commencing with de-bond of the wafer from a carrier wafer, after (i.e., post) grooving of the wafer, after lamination of the wafer to dicing tape supported on a film frame, and post dicing. If a 60 µm contaminant particle size is used as a baseline to determine compromised die (i.e., die kill), yield is progressively reduced from almost 100% post de-to little more than 90% post dicing, with about half of the defective die of a wafer compromised by silicon (i.e., solid) particles, and about half compromised by organic (i.e., transparent) particles. However, if a 20 µm contaminant particle size if use as the baseline, yield plummets from over 95% post de-bond to less than 75% post dicing, again with about half of the defective die of a wafer compromised by silicon (i.e., solid) particles, and about half compromised by organic (i.e., transparent) particles.

Accordingly, the inventors herein have recognized that continued protection of the exposed NCF surface until shortly before each individual die is picked up in a pick-and-place operation for stacking with other die would be desirable.

BRIEF DESCRIPTION OF THE DRAWINGS

FIGS. 5A-5D2 are a sequence of schematic cross-sectional views depicting a process for protecting an NCF on a semiconductor wafer from contamination prior to picking of semiconductor die of the wafer and illustrating two implementations thereof, according to embodiments of the disclosure;

FIGS. 9A1-9D are, in combination, a schematic illustration of a system for implementing embodiments of the disclosure.

DETAILED DESCRIPTION

The following description provides specific details, such as sizes, shapes, material compositions, and orientations in order to provide a thorough description of embodiments of the disclosure. However, a person of ordinary skill in the art would understand that the embodiments of the disclosure may be practiced without necessarily employing these specific details. Embodiments of the disclosure may be practiced in conjunction with conventional fabrication techniques employed in the industry. In addition, the description provided below does not form a complete process flow for manufacturing a 3D microelectronic device, or apparatus employed in such a process. Only those process acts and structures necessary to understand the embodiments of the disclosure are described in detail below. Additional acts to form a complete 3D microelectronic device, a complete structure including multiple stacked components, or a complete 3D microelectronic device may be performed by conventional fabrication processes.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

For the sake of convenience and clarity, like elements and features in the various embodiments of the disclosure as described herein are indicated by the same or similar reference numerals and other identifiers.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "comprising," "including," "containing," "characterized by," and grammatical equivalents thereof are inclusive or open-ended terms that do not exclude additional, unrecited elements or method steps, but also include the more restrictive terms "consisting of" and "consisting essentially of" and grammatical equivalents thereof.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be excluded.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

Figure 6A:
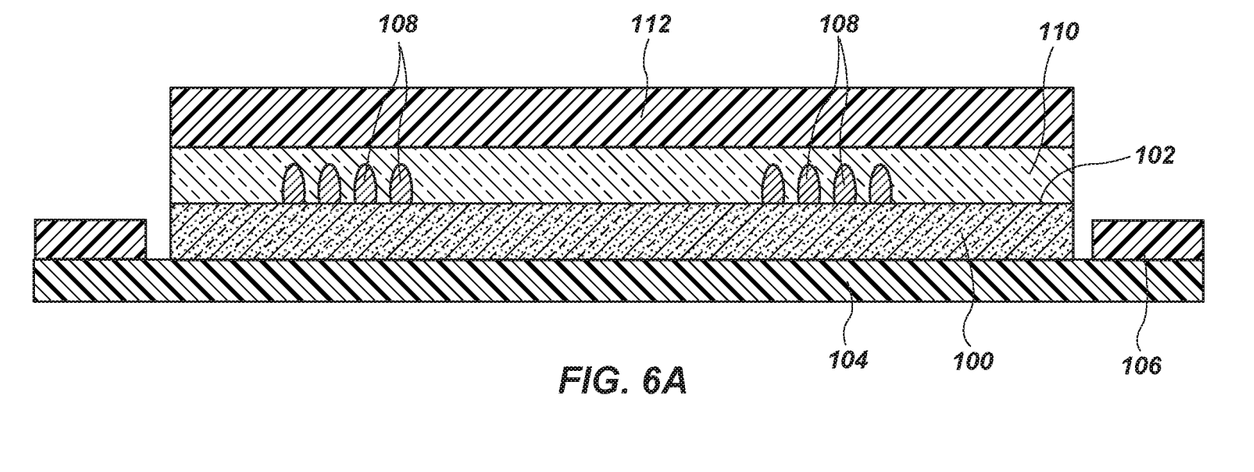
FIGS. 6A-6D are a sequence of schematic cross-sectional views depicting a process for protecting an NCF on a semiconductor wafer from contamination prior to picking of semiconductor die of the wafer and illustrating two implementations thereof, according to other embodiments of the disclosure.

Various embodiments of methods of the disclosure are described and illustrated herein. However, the embodiment share a common initial implementation, as illustrated in FIG. 6A, wherein a semiconductor (e.g., silicon) wafer.

FIGS. 5A through 5E depict, schematically, a wafer singulation and semiconductor die pick processing sequence according to an embodiment of the disclosure for a semiconductor wafer having a NCF laminated over an active surface thereof. Such an arrangement is employed when semiconductor die singulated from a wafer are to be stacked with the NCF providing a dielectric in the bond line between adjacent die.

Figure 5A:
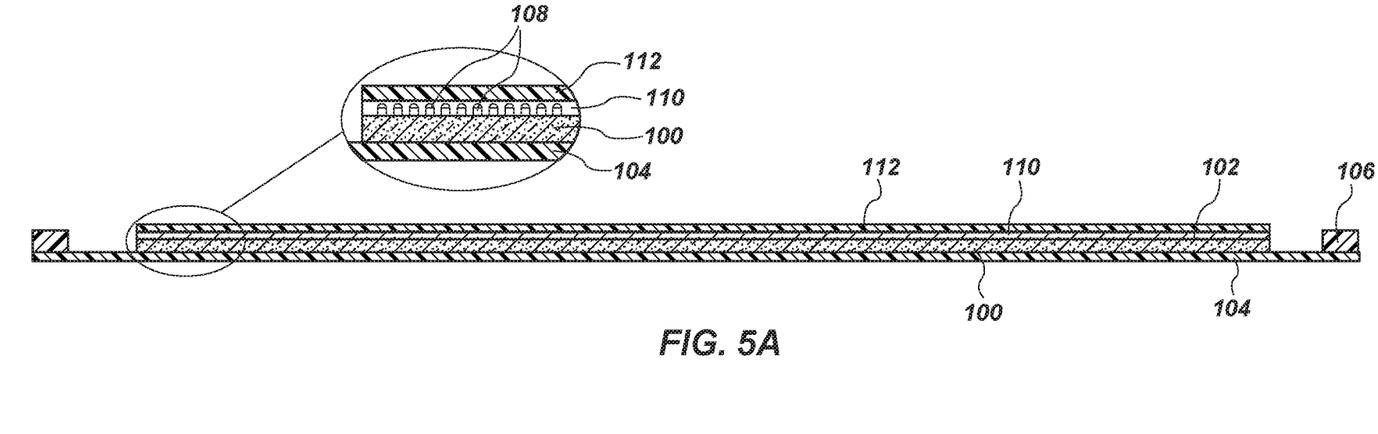

As shown in FIG. 5A, semiconductor wafer 100 is mounted, with an active surface 102 thereof facing upward, on dicing tape 104 supported on a film frame 106. Conductive pillars 108 protrude from active surface 102, and are covered with a NCF 110 of a thickness which may be greater than, equal to or less than a height of the conductive pillars. FIG. 5A illustrates an NCF 110 of a greater thickness than conductive pillars 108 as a non-limiting example. A protective film 112 adhered to NCF 110 covers NCF 110 to prevent contamination thereof. Such a protective film 112 may be provided on NCF 110 as received from a vendor, or may be photodefinable and in the form of a dry film photoresist, or a photodefinable polyimide, applied to NCF 110 after lamination to wafer 100. Suitable dry film photoresists are commercially available from numerous sources, including Nikko-Materials Co., Ltd., DuPont Electronics & Imaging, Engineered Materials Systems, Inc., and many others.

Figure 5B:
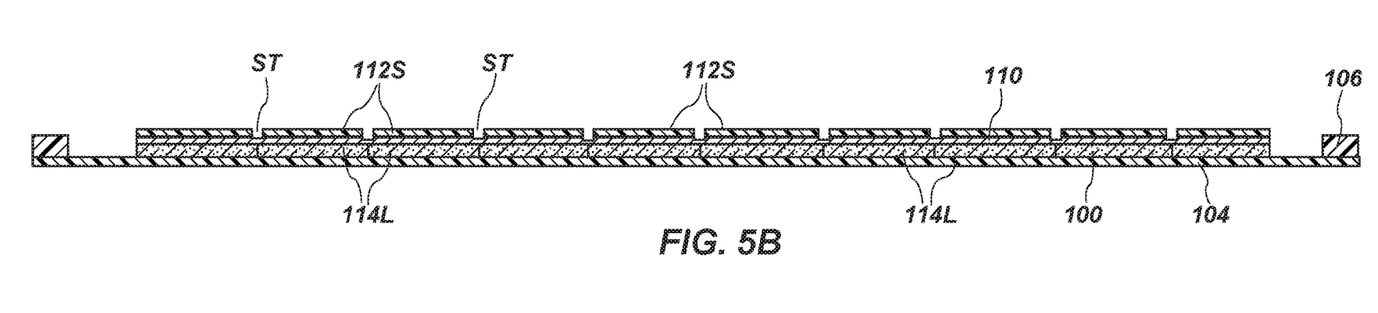

Conventionally, protective film 112 is stripped off of NCF 110 prior to singulation of semiconductor wafer 100. However, as shown in FIG. 5B, in lieu of removing protective film 112 after NCF 110 is laminated to wafer 100, die streets ST are lithographically opened up in protective film 112 extending into NCF 110 using a maskless aligner. Such maskless aligners are commercially available from, for example, EV Group (and identified as MLE technology), headquartered in Austria and having various U.S. locations, and from Heidelberg Instruments, Inc. (and identified as MLA 150) of Torrance, Calif. Thus, protective film segments 112S remain over NCF 110 over each semiconductor die location 114L of semiconductor wafer 100.

Figure 5C:
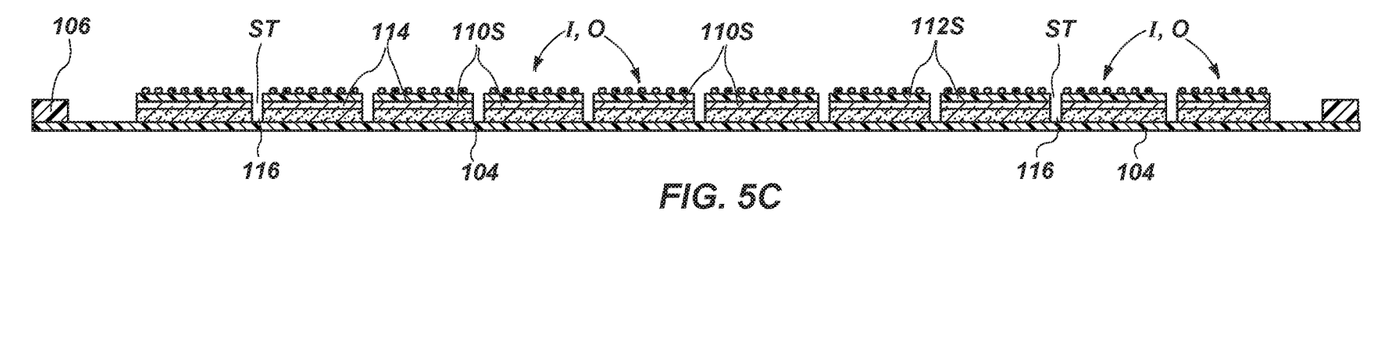

As shown in FIG. 5C, singulation of wafer 100 into semiconductor die 114 is effected within streets ST separating die locations 114L according to an embodiment of the disclosure using, for example, a diamond-coated dicing blade, resulting in scribes 116, which may also be termed kerfs, segmenting NCF 110 and wafer 100 respectively into NCF segments 110S and semiconductor die 114, extending to dicing tape 104. As a result of this process, inorganic particles I from the material of semiconductor wafer 100 and organic particles O from dicing tape 104 and NCF 110 are deposited (shown greatly enlarged for clarity) on protective film segments 112S rather than on NCF segments 110S. Other particulates may also disperse over protective film segments 112S, falling from neighboring die during pickup, as well as from the environment in which the wafer 100 resides.

Figure 5D:
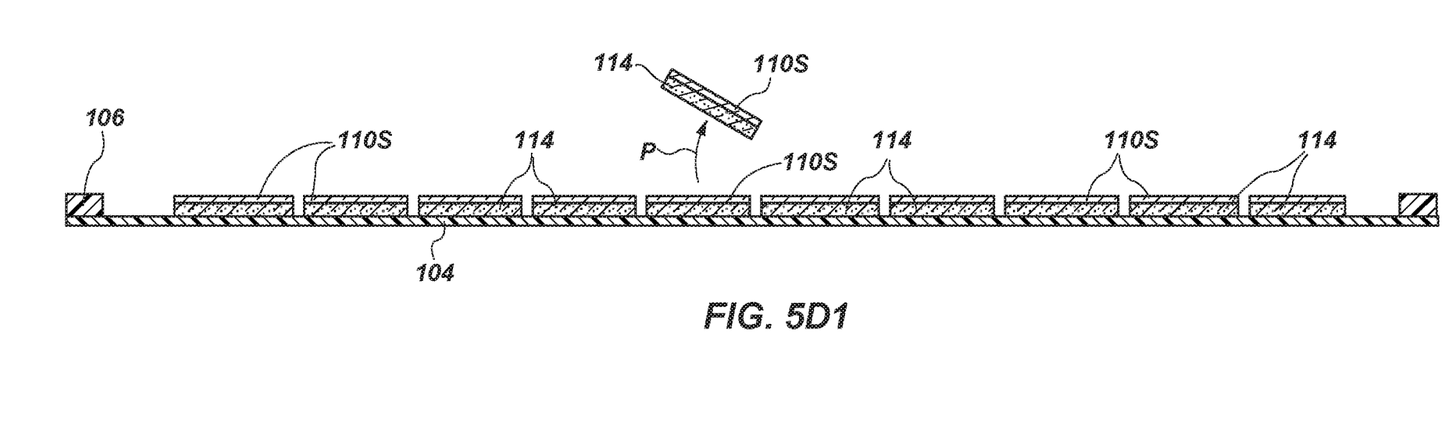
Figure 8:
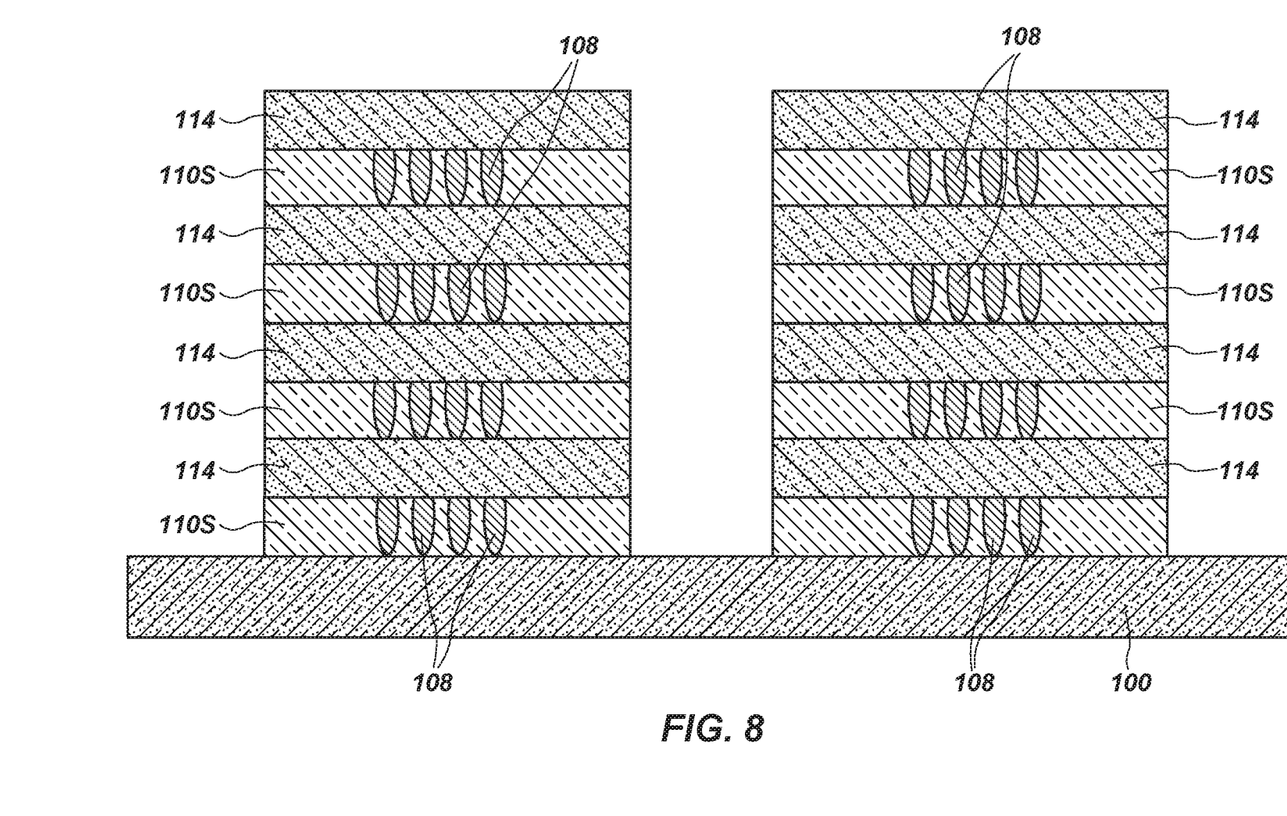
FIG. 8 is a schematic side cross-section of stacks of microelectronic components in the form of semiconductor die processed according to embodiments of the disclosure and mounted to a substrate.

As shown in FIG. 5D1, in one implementation of this embodiment of the disclosure, the protective film segments 112S are substantially concurrently removed from the semiconductor die 114 of the singulated wafer 100 using conventional de-tape equipment such as, for example, Takatori Semiconductor Process Equipment from GTI Technologies, Inc. of Shelton, Conn. or various de-tapers from Nitto Inc. of Teaneck, N.J. Following removal of the protective film segments 112S, each semiconductor die 114 having an NCF segment 110S is removed using a conventional pick and place apparatus of a thermocompression bonding tool, inverted and stacked on a base wafer 100 or other base substrate as shown in FIG. 8. Using this approach, contaminants in the form of inorganic and organic particles from singulation of semiconductor wafer 100 deposited on protective film segments 112S are removed when protective film segments 112S are stripped from NCF segments 110S prior to picking of the semiconductor die 114, so that picking of a die as shown by arrow P does not result in contaminant residue from an NCF segment 110S of the picked die 114 falling on other die 114.

Figure 5D:
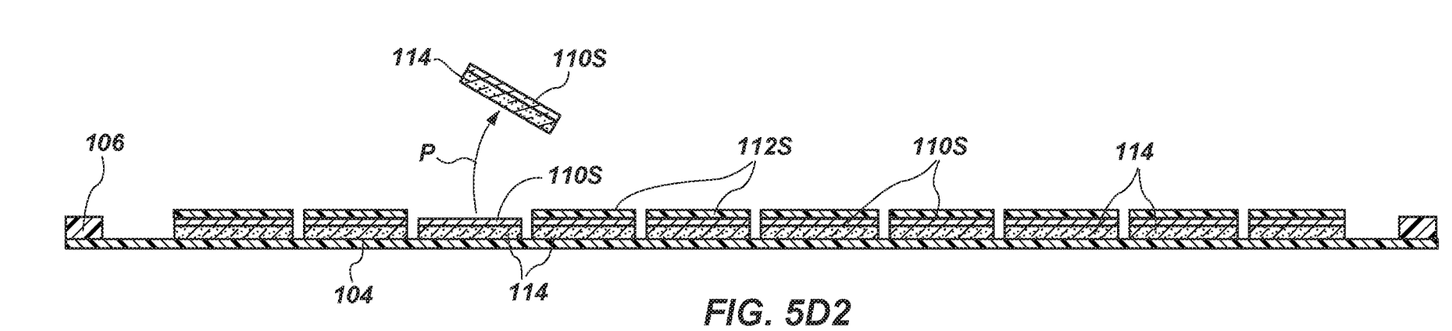

As shown in FIG. 5D2, in another implementation of this embodiment of the disclosure, the protective film segments 112s are allowed to remain on NCF segments 110S until immediately before each semiconductor die 114 is removed from dicing tape 104. In this implementation, a tool modification (described with respect to FIGS. 7A and 7B) to the pick and place apparatus of a thermocompression bonding tool used to remove each semiconductor die 114 from dicing tape 104 allows for individual removal of protective film segments 112S from each semiconductor die 114 immediately prior to such semiconductor die 114 being picked as shown by arrow P from dicing tape 104 for stacking on another die or wafer prior to thermocompression bonding of the stacked semiconductor die 114 or in some instances, a base wafer configured with semiconductor die locations. Thus, if contaminant residue exists on protective film segments 112S, if it falls during removal of a protective film segments 112S while being removed from a to-be-picked semiconductor die 114, it will fall on protective film segments 112S remaining on other semiconductor die 114, and not on the associated NCF segment 110S.

Figure 7A:
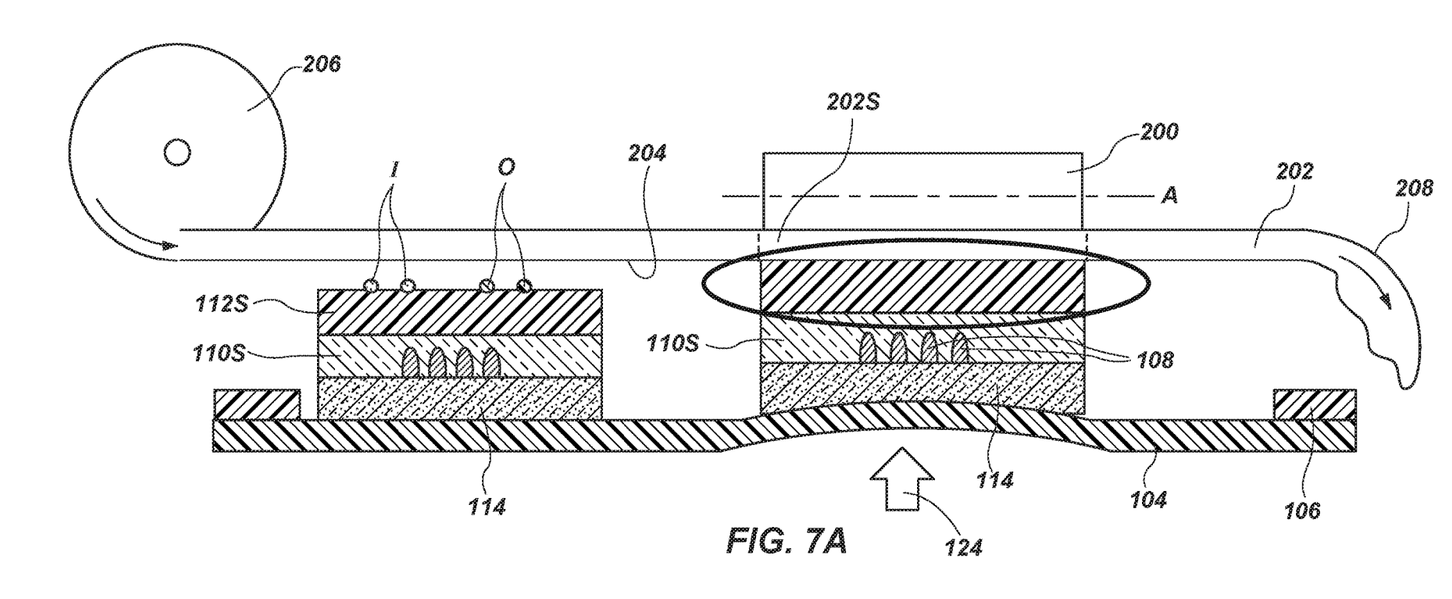
FIGS. 7A and 7B are schematic partial sectional side elevations of a method and apparatus for removing protective film segments from individual semiconductor die prior to picking thereof from a wafer.

To provide further detail, FIG. 7A shows a so-called "flipper head" 200 of a pick and place apparatus (e.g., a pick tool) cooperatively associated with a thermocompression bonding tool and used to remove each semiconductor die 114 with NCF segment 110S from dicing tape 104 and invert the assembly for stacking on another semiconductor die 114 or on a semiconductor wafer. The pick and place apparatus has been modified with a film assist bonding (FAB) unit, such as is employed with bond heads of thermocompression bonders to place a film between the bond head and the backside of a semiconductor die undergoing thermocompression bonding to prevent contamination of the bond head. However, in embodiments of the present disclosure, the FAB unit is equipped with a film 202 having an adhesive coating 204, which may be termed an adhesive film for convenience. In operation, the FAB unit is configured to place a segment 202S of film 202 having an adhesive 204 facing semiconductor die 114 between flipper head 200 and protective film segment 112S to allow flipper head 200 in a first pass to contact protective film segment 112S with adhesive 204 and lift off, or "de-tape" protective film segment 112S from NCF segment 110S as semiconductor die 114 is pressed upwardly against flipper head 200 as indicated by arrow 124. Film 202 may be fed as a continuous tape from a roller source 206 of the FAB unit to provide a fresh film segment 202S with adhesive 204 to contact a protective film segment 112s over the NCF segment 110S of a target semiconductor die 114 to pull that protective film segment 112S off of the NCF segment 110S, following which the film 202 is advanced by roller source 206 a sufficient distance to present a fresh film segment 202S.

Figure 7B:
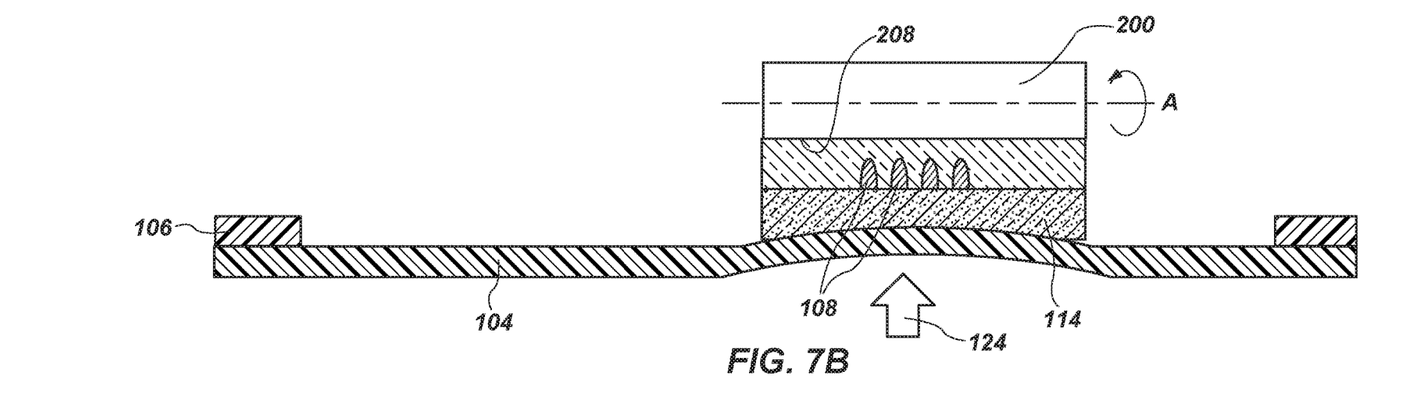

As shown in FIG. 7B, after the first pass to remove a protective film segment 112S, in one embodiment flipper head 200 may then be rotated 180° about axis A as shown, to place pick-up face 208 of flipper head 200 in position to retrieve right-hand semiconductor die 114 from dicing tape 104 in a second pass of the flipper head 200 as that die is pressed upwardly as indicated by arrow 124 to facilitate release from dicing tape 104. After the semiconductor die 114 is picked, flipper head 200 is then again rotated 180° about axis A to invert picked semiconductor die 114 with its back side facing upward and conductive pillars 108 facing downward for presentation and stacking of semiconductor die 114 for thermocompression bonding. After placement of the inverted semiconductor die 114, the pick and place apparatus returns flipper head 200 to semiconductor wafer 100, flipper head is again rotated 180°, and the protective film segment 112s of another target semiconductor die 114 is contacted with a fresh film segment 202S. Of course, film 202 may be advanced before or after a given target semiconductor die 114 is picked from wafer 100. It will be understood and appreciated by those of ordinary skill in the art that the apparatus to pick a semiconductor die singulated from a wafer and invert it for placement may comprise a pick and place tool separate from the bond head of the thermocompression bonding tool, or may be integral with the bond head, both configurations being known. Similarly, removal of protective film segments 112S may be effected by apparatus separate from that used to pick, lift and invert each singulated semiconductor die 114. Once a die stack or an array of die stacks is completed, a thermocompression bonding head is applied to the top of each die stack and heat and pressure (i.e., Normal force) is applied to cause conductive pillars 108 of each semiconductor die 114 to be forced through the material of the NCF and bond with aligned conductive pads on an upper surface of a next-lower die or wafer in the stack, while the resin material of the NCF in the bond line is concurrently cured. By way of example only, pillar-to-pad bonding may be effected by solder reflow in the case of solder-tipped pillars, or by diffusion bonding of metal (e.g., copper) pillars against compatible metal pads.

FIGS. 6A through 6D depict, schematically, a wafer singulation and semiconductor die pick process sequence according to an embodiment of the disclosure for a semiconductor wafer having a NCF laminated over an active surface thereof in preparation for stacking of the resulting semiconductor die. FIGS. 6A through 6D are enlarged for clarity of understanding this embodiment.

As shown in FIG. 6A, semiconductor wafer 100 is mounted, with an active surface 102 thereof facing upward, on dicing tape 104 supported on a film frame 106. Conductive pillars 108 protrude from active surface 102, and may be covered with a NCF 110 of a thickness greater than a height of the conductive pillars or, alternatively, with an NCF thickness commensurate with the height of conductive pillars 108. Suitable NCFs in the form of uniform thickness, B-staged, highly filled (with, for example, controlled-size silica particles) films are available, by way of example only, from Namics, Dow Electronic Materials and Henkel Electronic materials. A preformed protective film 112 covers and adheres to NCF 110 to prevent contamination thereof. Such a protective film 112 may be applied to NCF 110 after lamination of the latter to wafer 100, or may be preapplied to NCF 110 to protect NCF 110 during shipping and handling prior to application of NCF 110 to a semiconductor wafer 100.

Figure 6B:
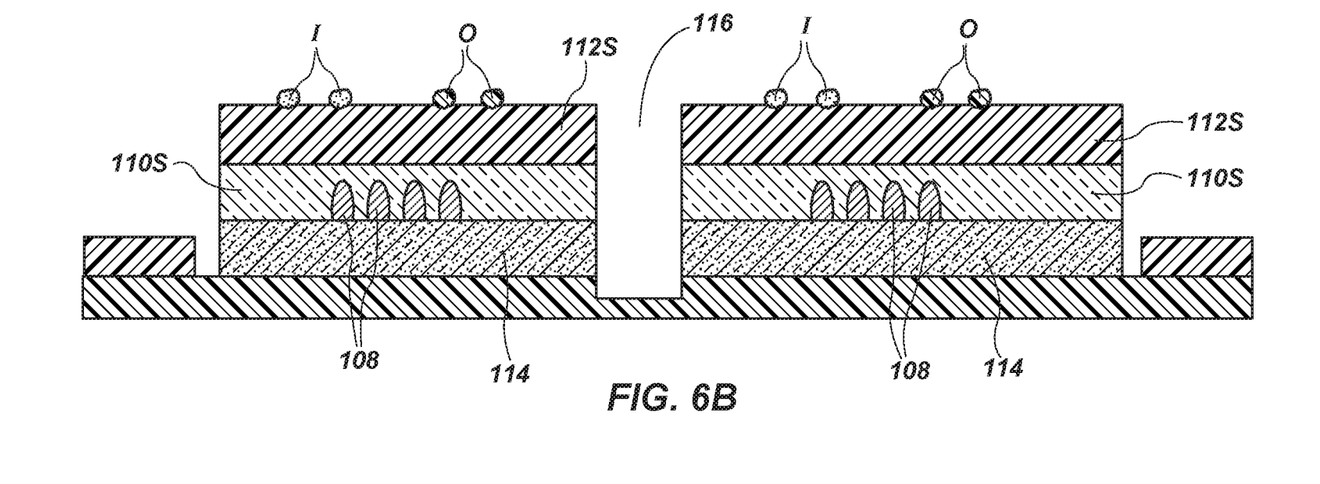

Conventionally, preformed protective film 112 is stripped off of NCF 110 prior to singulation of semiconductor wafer 100. However, as shown in FIG. 6B, singulation of wafer 100 into semiconductor die 114 is effected according to an embodiment of the disclosure using, for example, a diamond-coated dicing blade, resulting in scribes 116, which may also be termed kerfs, segmenting protective film 112, NCF 110 and wafer 100 respectively into protective film segments 112S, NCF segments 110S and semiconductor die 114, and extending to and slightly into, dicing tape 104. As a result of this process, inorganic particles I from the material of semiconductor wafer 100 and organic particles O from dicing tape 104, protective film segments 112S and NCF segments 110S are deposited on protective film segments 112S. Other particulates may also disperse over protective film segments 112S, falling from neighboring die during pickup, as well as from the environment in which the wafer 100 resides.

Figure 6C:
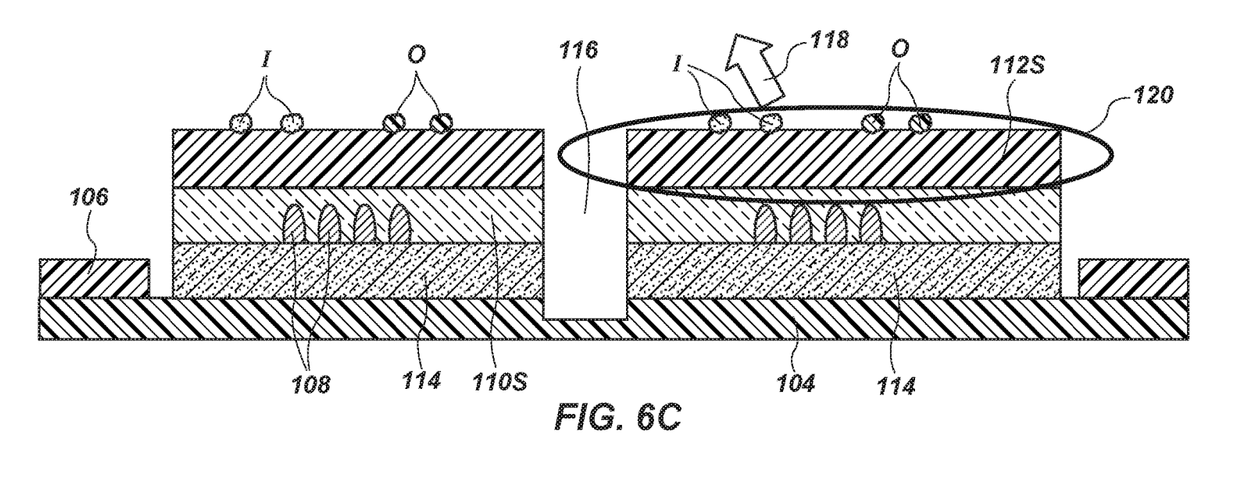

As shown in FIG. 6C, a protective film segment 112S over right-hand semiconductor die 114 is removed, as indicated by arrow 118. Prior to removal of protective film segment 112S, and depending upon the composition of protective film 112, this protective film segment 112S may be locally heated as indicated by ellipse 120, to weaken adhesion between that protective film segment 112S and its underlying NCF segment 110S, or all of the protective film segments 112S heated, for example in a low temperature oven. Suitable protective films include, for example, REVALPHA thermal release tape from Nitto Denko Corporation, offering low-temperature (e.g., 90° C.), zero-force release and no-residue removal. A similar product, Xinst6011-15 Degree Thermal Release Tape is available from Shenzhen Xinst Technology Co., Ltd. of Shenzen, People's Republic of China. Alternatively and by way of another example, protective film segments 112S of suitable composition and comprising a base polymer, oligomer and photoinitiator may be blanket-exposed to ultraviolet (UV) radiation (i.e., light) of 250-360 nm wavelength to weaken adhesion. Such films are available, for example, from Ultron Systems, Inc. of Moorpark, Calif. and Furukawa Electric Group, having various locations worldwide.

Figure 6D:
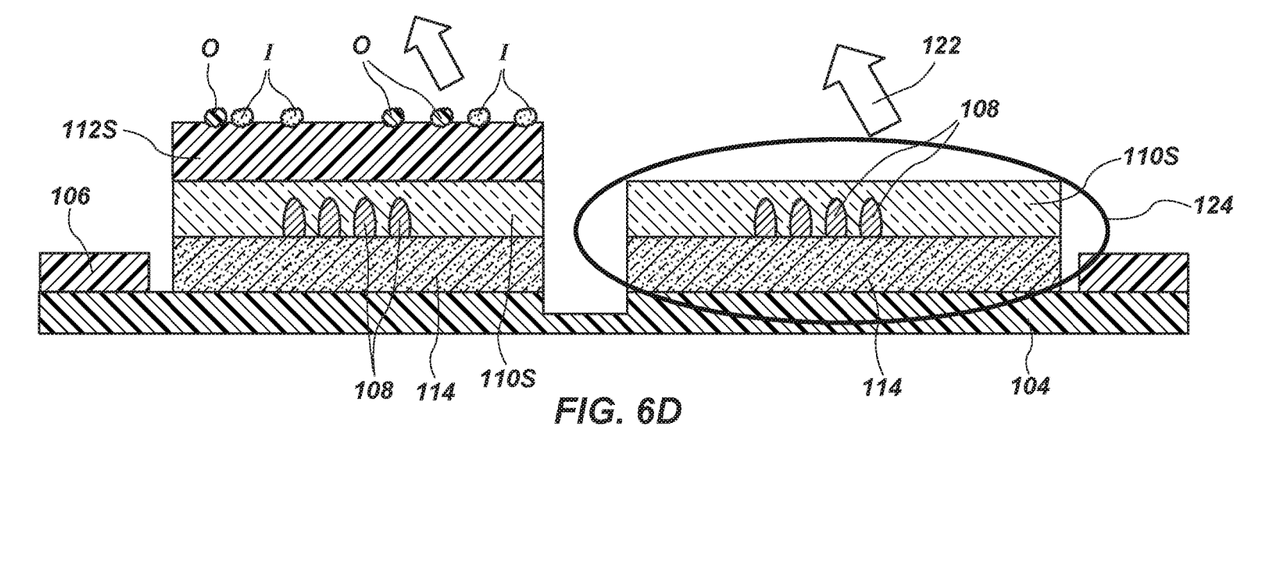

As shown in FIG. 6D, right-hand semiconductor die 114 with NCF segment 110S is removed from dicing tape 104 as indicated by arrow 122 and ellipse 120 for placement and stacking for thermocompression bonding to form a semiconductor device as, for example, illustrated in FIG. 8 depicting a stack of semiconductor die 114 on a base wafer 100 or other base substrate. As a result of the removal of right-hand semiconductor die 114, there is no substantial residue on NCF segment 110S to drop on left-hand semiconductor die 114. However, to the extent any additional residue in the form of inorganic particles I and organic particles O is present on NCF segment 110S of right-hand semiconductor die 114 or on the die itself, such residue will drop onto protective film segment 112S of left-hand semiconductor die 114, rather than on an exposed NCF segment 110S thereof.

To provide further detail, FIG. 7A shows a so-called "flipper head" 200 of a pick and place apparatus (e.g., a pick tool) cooperatively associated with a thermocompression bonding tool and used to remove each semiconductor die 114 with NCF segment 110S from dicing tape 104 and invert the assembly for stacking on another semiconductor die 114 or on a semiconductor wafer. The pick and place apparatus has been modified with a film assist bonding (FAB) unit, such as is employed with bond heads of thermocompression bonders to place a film between the bond head and the backside of a semiconductor die undergoing thermocompression bonding to prevent contamination of the bond head. However, in embodiments of the present disclosure, the FAB unit is equipped with a film 202 having an adhesive coating 204, which may be termed an adhesive film for convenience. In operation, the FAB unit is configured to place a segment 202S of film 202 having an adhesive 204 facing semiconductor die 114 between flipper head 200 and protective film segment 112S to allow flipper head 200 in a first pass to contact protective film segment 112S with adhesive 204 and lift off, or "de-tape" protective film segment 112S from NCF segment 110S as semiconductor die 114 is pressed upwardly against flipper 200 as indicated by arrow 124. Film 202 may be fed as a continuous tape from a roller source 206 of the FAB unit to provide a fresh film segment 202S with adhesive 204 to contact a protective film segment 112S over the NCF segment 110S of a target semiconductor die 114 to pull that protective film segment 112S off of the NCF segment 110S, following which the film 202 is advanced by driven roller 208 a sufficient distance to present a fresh film segment 202S.

As shown in FIG. 7B, after the first pass to remove a protective film segment 112S, in one embodiment flipper head 200 may then be rotated 180° about axis A as shown, to place pick-up face 208 of flipper head 200 in position to retrieve right-hand semiconductor die 114 from dicing tape 104 in a second pass of the flipper head 200 as that die is pressed upwardly as indicated by arrow 124 to facilitate release from dicing tape 104. After the semiconductor die 114 is picked, flipper head 200 is then again rotated 180° about axis A to invert picked semiconductor die 114 with its back side facing upward and conductive pillars 108 facing downward for presentation and stacking of semiconductor die 114 for thermocompression bonding. After placement of the inverted semiconductor die 114, the pick and place apparatus returns flipper head 200 to semiconductor wafer 100, flipper head is again rotated 180°, and the protective film segment 112s of another target semiconductor die 114 is contacted with a fresh film segment 202S. Of course, film 202 may be advanced before or after a given target semiconductor die 114 is picked from wafer 100. It will be understood and appreciated by those of ordinary skill in the art that the apparatus to pick a semiconductor die singulated from a wafer and invert it for placement may comprise a pick and place tool separate from the bond head of the thermocompression bonding tool, or may be integral with the bond head, both configurations being known. Similarly, removal of protective film segments 112S may be effected by apparatus separate from that used to pick, lift and invert each singulated semiconductor die 114. Once a die stack or an array of die stacks is completed, a thermocompression bonding head is applied to the top of each die stack and heat and pressure (i.e., Normal force) is applied to cause conductive pillars 108 of each semiconductor die 114 to be forced through the material of the NCF and bond with aligned conductive pads on an upper surface of a next-lower die or wafer in the stack, while the resin material of the NCF in the bond line is concurrently cured. By way of example only, pillar-to-pad bonding may be effected by solder reflow in the case of solder-tipped pillars, or by diffusion bonding of metal (e.g., copper) pillars against compatible metal pads.

Figure 9A:
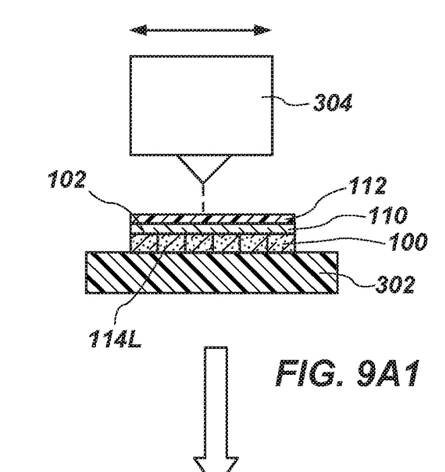
Figure 9A:
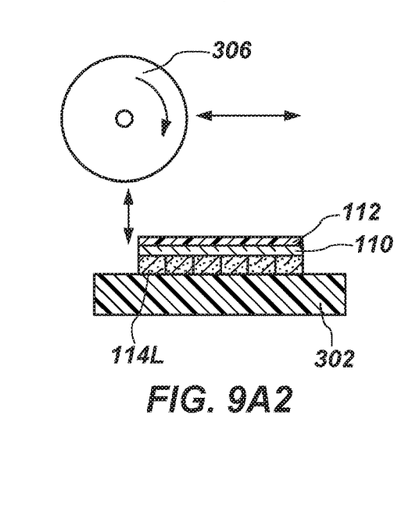
Figure 9B:
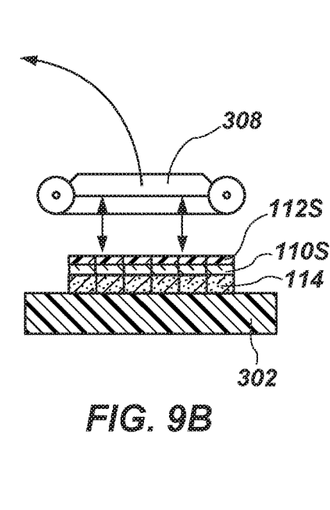
Figure 9C:
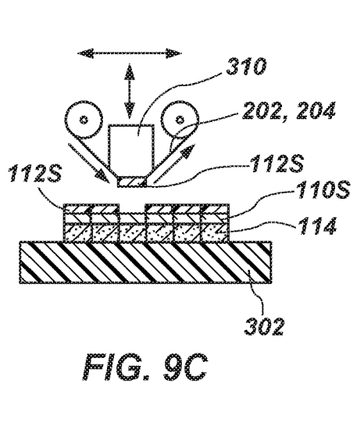
Figure 9D:
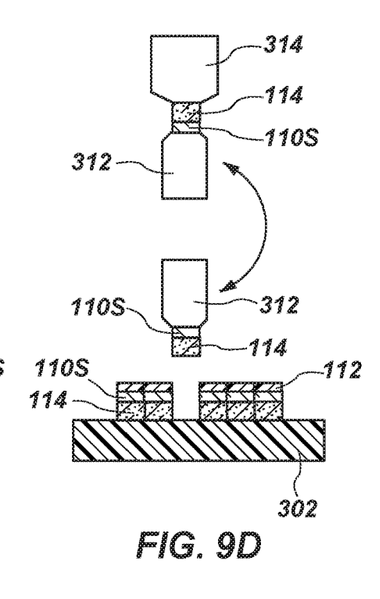

Referring now to FIGS. 9A1-9D and first to FIG. 9A1, system 300 comprises a support 302, for example dicing tape supported by a film frame configured for supporting a substrate, for example a semiconductor wafer 100, configured with microelectronic device locations, for example semiconductor die locations 114L. Semiconductor wafer 100 has NCF 110 on an active surface 102 thereof, and protective film 112 located on NCF 110. In an embodiment, a maskless aligner 304 is employed to segment protective film 112 which may, in such embodiment, comprise a dry photoresist. As shown in FIG. 9A2, dicing saw 306 is mounted and configured for singulating semiconductor die locations 114L into microelectronic devices, for example semiconductor die 114, as shown in FIG. 9B. Dicing saw separates wafer 100 into semiconductor die 114 each having a NCF segment 110S and a protective film segment thereon. Protective film 112 may or may not have already been segmented, depending on the embodiment. Further, if protective film 112 comprises a thermal release tape or a UV-sensitive film, heat or ultraviolet radiation may be applied to protective film 112 with appropriate apparatus to weaken adhesion to NCF 110 and facilitate removal. In FIG. 9B, a de-taping apparatus 308 may be employed to lift all of the protective film segments 112S substantially concurrently from NCF segments 110S. Alternatively and as shown in FIG. 9C, a film assist bond (FAB) unit 310 may be modified with the use of a tape 202 with an adhesive 204 thereon to contact each protective film segment 112S individually and lift it from an underlying NCF segment 110S, following which, as shown in FIG. 9D, the underlying NCF segment 110S and its associated semiconductor die 114 are removed from support 302 by pick tool 312 cooperatively associated with a thermocompression bonding apparatus. The pick tool 312 with semiconductor die 114 and NCF segment 110S is then inverted and presented to bond head 314 for movement to, and stacking upon, another component, as known to those of ordinary skill in the art. Alternatively, the pick tool may be configured to not only invert semiconductor die 114 but also move the die and stack it independent of a bond head. Of course, as previously described, the removal of protective film segments using the FAB unit 310 may be incorporated in the function of the pick tool 312. Regardless of the embodiment implemented, whether all protective film segments 112S are removed substantially concurrently or individually, the potential for contamination of the NCF segments 110S is markedly reduced, if not eliminated.

By significantly reducing the potential for surface contamination of NCF after lamination on a semiconductor wafer until a short period before, or even immediately before, semiconductor die singulated from the wafer are picked from dicing tape and stacked, yield of semiconductor devices comprising stacked die processed according to embodiments of the disclosure may be significantly improved by marked reduction in potential for die cracking at the bond lines, as well as marked reduction in open circuits between conductive pillars and pads of adjacent die. Notably, embodiments of the disclosure allow multiple pick passes of semiconductor die from the same wafer without the risk of contaminant particles from a die being picked falling on other die of the same wafer still on the dicing tape. Further, embodiments of the disclosure eliminate any need to store NCF-laminated unsingulated semiconductor wafers awaiting singulation in a processing queue in chambers filled with an inert (e.g., $N_2$) atmosphere to reduce contamination potential, thus reducing handling time, processing expense, eliminating equipment and gas cost, and reducing space requirements in the fab facility.

In embodiments, a method comprises providing a substrate having a non-conductive film (NCF) thereon and a protective film on the NCF, segmenting the protective film to correspond to microelectronic device locations of the substrate, separating the substrate into microelectronic devices corresponding to the microelectronic device locations, lifting the segmented protective film from the microelectronic devices and removing microelectronic devices from which the segmented protective film has been lifted.

In embodiments, a method comprises providing a substrate having a non-conductive film (NCF) thereon and a protective film on the NCF, segmenting the protective film to correspond to microelectronic device locations of the substrate, separating the substrate into microelectronic devices corresponding to the microelectronic device locations, lifting the segmented protective film from the microelectronic devices and removing microelectronic devices from which the segmented protective film has been lifted.

In embodiments, a system comprises a support for a substrate configured with microelectronic device locations, a dicing saw programmed to singulate the substrate into microelectronic devices, apparatus for removing segments of protective film from NCF segments on the microelectronic devices, a pick tool for lifting and inverting individual microelectronic devices for placement on other components to form component stacks, and a bond head for thermocompression bonding conductive elements of the component stacks.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method, comprising:
applying a protective film to a non-conductive film (NCF) located over an active surface of a semiconductor wafer, wherein applying a protective film to a non-conductive film (NCF) located over an active surface of a semiconductor wafer comprises applying a dry film photoresist to the NCF and;
separating the protective film into protective film segments between die locations on the semiconductor wafer, wherein separating the protective film into segments between die locations on the semiconductor wafer comprises patterning the dry film photoresist with a maskless aligner;
singulating the die locations on the semiconductor wafer into semiconductor die each having an NCF segment thereover;
physically removing the protective film segments from the NCF segments; and
picking individual semiconductor die.

2. The method of claim 1, further comprising:
physically removing the protective film segments from the NCF segments substantially concurrently; and
picking the individual semiconductor die after all protective film segments are removed from the NCF segments.

3. The method of claim 1, further comprising:
physically removing the protective film segments from the NCF segments one segment at a time; and
picking each individual semiconductor die after an associated protective film segment has been removed from an NCF segment of that individual semiconductor die and before physically removing a protective film segment from an NCF segment of another semiconductor die.

4. The method of claim 1, wherein separating the protective film into protective film segments is effected before singulating the die location on the semiconductor wafer into semiconductor die each having an NCF segment thereover.

5. The method of claim 1, wherein separating the protective film into protective film segments and singulating the die locations on the semiconductor wafer into semiconductor die each having an NCF segment thereover is effected substantially concurrently.

6. The method of claim 1, wherein picking individual semiconductor die is effected either by a pick tool cooperatively associated with a thermocompression bonding apparatus, or by a bond head carrying the pick tool.

7. The method of claim 6, further comprising inverting each individual semiconductor die after picking thereof and stacking on another component.

8. The method of claim 1, wherein the protective film segments are substantially concurrently removed from the NCF using a de-taping apparatus.

9. The method of claim 1, wherein the protective film segments are removed from each semiconductor die immediately prior to picking thereof by applying an adhesive film segment to only a protective film segment of the respective semiconductor die and lifting the protective film segment of the respective die from the NCF segment.

10. A method, comprising:
applying a protective film to a non-conductive film (NCF) located over an active surface of a semiconductor wafer comprising adhering a preformed protective film to the NCF;
substantially concurrently separating the protective film into protective film segments between die locations on the semiconductor wafer and singulating the die locations on the semiconductor wafer into individual semiconductor die each having an NCF segment thereover in a dicing act;
weakening adhesion of the preformed protective film to the NCF by applying at least one of heat and ultraviolet radiation to the preformed protective film;
after weakening adhesion of the preformed protective film to the NCF, physically removing the protective film segments from the NCF segments on each respective individual semiconductor die immediately prior to picking thereof using an adhesive film segment contacting only a protective film segment of the NCF segment on the respective individual semiconductor die to lift the protective film segment of the respective individual die from the NCF segment; and
picking individual semiconductor die.

11. A method, comprising:
providing a substrate having a non-conductive film (NCF) thereon and a protective film on the NCF in the form of a dry film photoresist;
segmenting the protective film to correspond to microelectronic device locations of the substrate by patterning the dry film photoresist with a maskless aligner;
separating the substrate and the NCF into microelectronic devices corresponding to the microelectronic device locations, each microelectronic device bearing an NCF segment thereon;
lifting the segmented protective film from the NCF segments of the microelectronic devices; and
removing microelectronic devices from which the segmented protective film has been lifted.

12. The method of claim 11, further comprising:
lifting the segmented protective film from the NCF segments of the microelectronic devices substantially concurrently; and
picking the microelectronic devices after all of the segmented protective film has been lifted.

13. The method of claim 11, further comprising:
lifting segments of the segmented protective film from NCF segments of the microelectronic devices individually; and
picking each microelectronic device after lifting its associated protective film segment therefrom before lifting another protective film segment.

14. The method of claim 11, further comprising segmenting the protective film before separating the substrate and NCF into microelectronic devices.

15. The method of claim 11, further comprising segmenting the protective film and separating the substrate and NCF into microelectronic devices substantially concurrently.

16. The method of claim 11, wherein segments of the segmented protective film are substantially concurrently lifted from NCF segments using a de-taping apparatus.

17. The method of claim 11, further comprising lifting the segmented protective film one segment at a time from an NCF segment by adhesive contact with, and lifting by, a movable element.

18. A method, comprising:
providing a substrate having a non-conductive film (NCF) thereon and a preformed protective film on and adhered to the NCF;
substantially concurrently segmenting the protective film and NCF to correspond to microelectronic device locations of the substrate and separating the substrate into microelectronic devices corresponding to the microelectronic device locations, each microelectronic device bearing an NCF segment thereon;
applying at least one of heat and ultraviolet radiation to weaken adhesion of the preformed protective film to the NCF;
after applying the at least one of heat and ultraviolet radiation, lifting segments of protective film from NCF segments of the microelectronic devices comprising removing each segment of protective film from an NCF segment of a microelectronic device by contacting with an adhesive film segment immediately prior to removing that microelectronic device; and
removing microelectronic devices from which the segmented protective film has been lifted.

19. A system, comprising:
a support for a substrate configured with microelectronic device locations;
a dicing saw programmed to singulate the substrate into microelectronic devices;
apparatus for removing individual segments of protective film from non-conductive film (NCF) segments on the microelectronic devices;
a pick tool for lifting and inverting individual microelectronic device for placement on other components to form component stacks; and
a bond head for thermocompression bonding conductive elements of the component stacks.

20. The system of claim 19, wherein the apparatus for removing individual segments of protective film from NCF segments on the microelectronic devices comprises a de-taping apparatus operable to lift the individual segments of protective film from the NCF segments substantially concurrently.

21. The system of claim 19, wherein the apparatus for removing individual segments of protective film from NCF segments comprises a film assist bond unit configured to lift the individual segments of protective film one at a time.

22. The system of claim 21, wherein the film assist bond unit is associated with the pick tool.

23. The system of claim 19, further comprising apparatus for weakening of adhesion of segments of protective film from NCF segments prior to removing the segments of protective film.

24. The system of claim 23, wherein the apparatus for weakening of adhesion of segments of protective film from NCF segments comprises a heat source or a source of ultraviolet radiation.

* * * * *